United States Patent
Song et al.

(10) Patent No.: US 10,134,628 B2
(45) Date of Patent: Nov. 20, 2018

(54) MULTILAYER STRUCTURE INCLUDING DIFFUSION BARRIER LAYER AND DEVICE INCLUDING THE MULTILAYER STRUCTURE

(71) Applicant: Samsung Electronics Co., Ltd., Suwon-si, Gyeonggi-do (KR)

(72) Inventors: Hyunjae Song, Hwaseong-si (KR); Seunggeol Nam, Suwon-si (KR); Seongjun Park, Seoul (KR); Keunwook Shin, Yongin-si (KR); Hyeonjin Shin, Suwon-si (KR); Jaeho Lee, Seoul (KR); Changseok Lee, Siheung-si (KR); Yeonchoo Cho, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/172,908

(22) Filed: Jun. 3, 2016

(65) Prior Publication Data

US 2017/0033003 A1    Feb. 2, 2017

(30) Foreign Application Priority Data

Jul. 31, 2015    (KR) ........................ 10-2015-0108864

(51) Int. Cl.
| | |
|---|---|
| *H01L 23/532* | (2006.01) |
| *H01L 21/768* | (2006.01) |
| *H01L 23/485* | (2006.01) |
| *H01L 21/285* | (2006.01) |
| *H01L 29/45* | (2006.01) |

(52) U.S. Cl.
CPC .. *H01L 21/76846* (2013.01); *H01L 21/28525* (2013.01); *H01L 21/28568* (2013.01); *H01L 23/485* (2013.01); *H01L 23/53209* (2013.01); *H01L 23/53238* (2013.01); *H01L 23/53266* (2013.01); *H01L 23/53271* (2013.01); *H01L 29/45* (2013.01)

(58) Field of Classification Search
CPC ......... H01L 23/53209; H01L 23/53238; H01L 23/53266; H01L 23/53271
See application file for complete search history.

(56) References Cited

U.S. PATENT DOCUMENTS

| | | | | |
|---|---|---|---|---|
| 5,616,947 A * | 4/1997 | Tamura | ............. | H01L 21/28264 257/289 |
| 8,084,799 B2 * | 12/2011 | Happ | ................. | G11C 11/5678 257/296 |
| 8,754,434 B1 * | 6/2014 | Gollier | ................ | H01L 51/5253 257/434 |
| 8,916,973 B1 | 12/2014 | Kim et al. | | |
| 9,324,634 B2 | 4/2016 | Bao et al. | | |
| 2008/0017894 A1 * | 1/2008 | Happ | .................. | G11C 11/5678 257/246 |
| 2008/0145702 A1 | 6/2008 | Shin et al. | | |
| 2010/0176365 A1 * | 7/2010 | Park | ...................... | H01L 45/124 257/3 |
| 2011/0057156 A1 * | 3/2011 | Schaumburg | ........... | C01F 11/02 252/609 |
| 2013/0113102 A1 | 5/2013 | Bao et al. | | |
| 2013/0146116 A1 * | 6/2013 | Jovovic | .................... | H01B 1/16 136/200 |
| 2014/0027715 A1 * | 1/2014 | Mehr | .................... | H01L 29/267 257/29 |
| 2014/0070168 A1 | 3/2014 | Seneor et al. | | |
| 2015/0068580 A1 * | 3/2015 | Probst | ............... | H01L 31/03923 136/244 |
| 2015/0122315 A1 | 5/2015 | Shin et al. | | |
| 2015/0155374 A1 * | 6/2015 | Byun | ................ | H01L 29/66977 257/192 |
| 2015/0179839 A1 * | 6/2015 | Van Duren | ......... | H01L 31/0749 136/256 |

FOREIGN PATENT DOCUMENTS

| | | |
|---|---|---|
| EP | 2869348 A1 | 5/2015 |
| JP | 2008-153649 A | 7/2008 |
| KR | 10-2014-0085376 A | 7/2014 |

(Continued)

OTHER PUBLICATIONS

"7.8: Cubic Lattices and Close Packing", Chemwiki, <http://chemsiki.ucdavis.edu>, pp. 1-8, (2015).
"Looking at graphene and other 2D crystals in energy conversion and storage", www.nanowerk.com <http://www.nanowerk.com>, pp. 1-26, (2015).
Extended European Search Report dated Nov. 4, 2016 issued in corresponding European Patent Application No. 16176425.3.
Moussavi, et al. "Comparison of Barrier Materials and Deposition Processes for Copper Integration," IEEE, pp. 98-295-98-297 (1998).

*Primary Examiner* — David Zarneke
(74) *Attorney, Agent, or Firm* — Harness, Dickey & Pierce, P.L.C.

(57) ABSTRACT

A multilayer structure includes a first material layer, a second material layer, and a diffusion barrier layer. The second material layer is connected to the first material layer. The second material layer is spaced apart from the first material layer. The diffusion barrier layer is between the first material layer and the second material layer. The diffusion barrier layer may include a two-dimensional (2D) material. The 2D material may be a non-graphene-based material, such as a metal chalcogenide-based material having a 2D crystal structure. The first material layer may be a semiconductor or an insulator, and the second material layer may be a conductor. At least a part of the multilayer structure may constitute an interconnection for an electronic device.

28 Claims, 26 Drawing Sheets

(56) References Cited

FOREIGN PATENT DOCUMENTS

KR      2015-0021362 A     3/2015
WO    WO-2015/111898 A1    7/2015

* cited by examiner

< Side view >

< Side view >

< Top view >

MULTILAYER STRUCTURE INCLUDING DIFFUSION BARRIER LAYER AND DEVICE INCLUDING THE MULTILAYER STRUCTURE

CROSS-REFERENCE TO RELATED APPLICATION

This application claims priority under 35 U.S.C. § 119 to Korean Patent Application No. 10-2015-0108864, filed on Jul. 31, 2015, in the Korean Intellectual Property Office, the disclosure of which is incorporated herein in its entirety by reference.

BACKGROUND

1. Field

The present disclosure relates to a diffusion barrier layer, a multilayer structure including the diffusion barrier layer, and/or a device including the multilayer structure.

2. Description of the Related Art

In general, many electronic devices and semiconductor devices are manufactured by combining and connecting semiconductors, insulators, and conductors with one another. For example, various integrated circuits (ICs) are manufactured by forming a plurality of unit elements on a semiconductor substrate and repeatedly stacking insulating layers (interlayer insulating layers) and electrode lines on the plurality of unit elements.

However, when the electronic devices or the semiconductor devices are manufactured in this way or under operation, temperatures of constituent layers thereof may increase and an electrical stress may occur due to application of a voltage or current. Therefore, materials (atoms) diffuse between adjacent constituent layers, thus causing a degradation in the characteristics of the electronic devices or semiconductor devices and also a reduction in the reliability and durability thereof. As the degree of integration of the electronic devices or the semiconductor devices increases, it is more difficult to solve limitations caused by the diffusion of materials between constituent layers.

SUMMARY

Provided are diffusion barrier layers having excellent characteristics and/or multilayer structures including the diffusion barrier layers.

Provided are diffusion barrier layers including two-dimensional (2D) materials and/or multilayer structures including the diffusion barrier layers.

Provided are diffusion barrier layers which may be formed to have a very small thickness so as to be suitable for high-integration devices, and/or multilayer structures including the diffusion barrier layers.

Provided are devices including the diffusion barrier layers and/or the multilayer structures.

Provided are methods of forming the diffusion barrier layers and/or methods of manufacturing the devices.

Additional aspects will be set forth in part in the description which follows and, in part, will be apparent from the description, or may be learned by practice of example embodiments.

According to example embodiments, a multilayer structure includes a first material layer, a second material layer, and a diffusion barrier layer. The second material layer is connected to the first material layer and spaced apart from the first material layer. The diffusion barrier layer is between the first material layer and the second material layer. The diffusion barrier layer includes a non-graphene-based two-dimensional (2D) material.

In example embodiments, the 2D material may include a metal chalcogenide-based material having a 2D crystal structure.

In example embodiments, the metal chalcogenide-based material may include at least one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb). The metal chalcogenide-based material may include at least one chalcogen element selected from the group consisting of sulfur (S), selenium (Se), tellurium (Te), and oxygen (O).

In example embodiments, the 2D material may include a transition metal dichalcogenide (TMDC).

In example embodiments, the 2D material may have a trigonal prismatic crystal structure or an octahedral crystal structure.

In example embodiments, the diffusion barrier layer may have a thickness of greater than 0 nm and less than or equal to about 10 nm.

In example embodiments, the diffusion barrier layer may have a thickness of greater than 0 nm and less than or equal to about 5 nm.

In example embodiments, the diffusion barrier layer may have a thickness of greater than 0 nm and less than or equal to about 3 nm.

In example embodiments, the diffusion barrier layer may have a resistivity of about $10^{-2}$ Ω·cm or less. For example, the diffusion barrier layer may have a resistivity of about $10^{-4}$ Ω·cm to about $10^{-2}$ Ω·cm.

In example embodiments, the diffusion barrier layer may be doped with a dopant.

In example embodiments, the first material layer may include an insulator, and the second material layer may include a conductor.

In example embodiments, the first material layer may include a semiconductor, and the second material layer may include a conductor.

In example embodiments, the multilayer structure may include a conductor, an understructure, and an insulating material on the understructure. The insulating material layer may define an opening. The diffusion barrier layer may cover the insulating material layer in the opening. The conductor may cover the diffusion barrier layer in the opening. The first material layer may include at least a part of one of the understructure and the insulating material. The second material layer may include at least a part of the conductor.

In example embodiments, the multilayer structure may further include an adhesion layer between the diffusion barrier layer and one of the first and second material layers.

In example embodiments, the adhesion layer may include at least one metal selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb).

In example embodiments, the metal in the adhesion layer may include be the same as the a metal in the diffusion barrier layer.

In example embodiments, the diffusion barrier layer may include different types of a plurality of 2D material layers. A first 2D material layer among the plurality of 2D material layers may include the non-graphene based 2D material.

In example embodiments, at least a part of the multilayer structure may constitute an interconnection for an electronic device.

According to an aspect of example embodiments, a device may include the above-described multilayer structure with the diffusion barrier layer.

According to example embodiments, an electronic device includes an understructure, an insulating material on the understructure and defining an opening, a diffusion barrier layer that covers the opening of insulating material layer on an understructure, and a conductor. The diffusion barrier layer may include a non-graphene-based two-dimensional (2D) material. The conductor may be on the diffusion barrier layer in the opening.

In example embodiments, the 2D material may include a metal chalcogenide-based material having a 2D crystal structure.

In example embodiments, the metal chalcogenide-based material may include at least one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb). The metal chalcogenide-based material may include at least one chalcogen element selected from the group consisting of sulfur (S), selenium (Se), tellurium (Te), and oxygen (O).

In example embodiments, the 2D material may include transition metal dichalcogenide (TMDC).

In example embodiments, the 2D material may have a trigonal prismatic crystal structure or an octahedral crystal structure.

In example embodiments, the diffusion barrier layer may have a thickness greater than 0 nm and less than or equal to about 10 nm.

In example embodiments, the diffusion barrier layer may have a thickness greater than 0 nm and less than or equal to about 5 nm.

In example embodiments, the diffusion barrier layer may have a thickness greater than 0 nm and less than or equal to about 3 nm.

In example embodiments, the diffusion barrier layer may have a resistivity of about $10^{-2}$ Ω·cm or less. For example, the diffusion barrier layer may have a resistivity of about $10^{-4}$ Ω·cm to about $10^{-2}$ Ω·cm.

In example embodiments, the diffusion barrier layer may be doped with a dopant.

In example embodiments, the understructure may include a semiconductor region, and the diffusion barrier layer may limit or prevent a material from diffusing between the semiconductor region and the conductor.

In example embodiments, the diffusion barrier layer may limit or prevent a material from diffusing between the insulating material layer and the conductor.

In example embodiments, the electronic device may further include an adhesion layer between the diffusion barrier layer and the conductor.

In example embodiments, the adhesion layer may include at least one metal selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb).

In example embodiments, the metal in the adhesion layer may include be the same as the a metal in the diffusion barrier layer.

In example embodiments, the diffusion barrier layer may include different types of a plurality of 2D material layers. A first 2D material layer among the plurality of 2D material layers may include the non-graphene based 2D material.

In example embodiments, the electronic device may include an interconnect portion. The interconnect portion may include an active device portion on a substrate portion. The interconnect portion may be on the active device portion. The interconnect portion may include the insulating material layer, the diffusion barrier layer, and the conductor.

According to example embodiments, a multilayer structure includes a diffusion barrier layer, a first material layer connected to a first surface of the diffusion barrier layer, and a second material layer connected to a second surface of the diffusion barrier layer. The diffusion barrier layer includes a non-graphene based two-dimensional (2D) material. The second surface of the diffusion barrier layer is opposite the first surface of the diffusion barrier layer. The second material layer and the first material layer include different materials compared to each other.

In example embodiments, the diffusion barrier layer may include a transition metal dichalcogenide (TMDC).

In example embodiments, the diffusion barrier layer may extend between the first material layer and the second material layer. A thickness of the diffusion barrier layer may be greater than 0 nm and less than or equal to about 10 nm. The 2D material may have a trigonal prismatic crystal structure or an octahedral crystal structure.

In example embodiments, the multilayer structure may include an adhesion layer between the diffusion barrier layer and one of the first material layer and the second material layer. The adhesion layer may be directly connected to the diffusion barrier layer and one of the first material layer and the second material layer. A material of the adhesion layer may be different than a material of the diffusion barrier layer and the one of the first material layer and the second material layer.

In example embodiments, an electronic device may include an understructure, an insulating material layer on the understructure, the diffusion barrier layer from one of above-described multilayer structures, and a conductor. The insulating layer may define an opening. The diffusion barrier layer may cover the opening of the insulating material layer. The conductor may be on the diffusion barrier layer in the opening. The first material layer may include at least a part of one of the understructure and the insulating material layer. The second material layer may include at least a part of the conductor.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
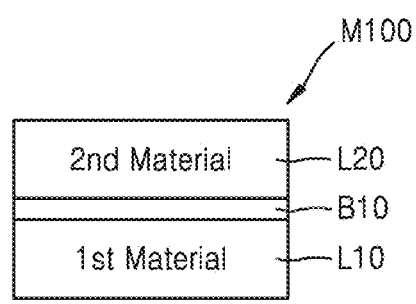
FIG. 1 is a cross-sectional view of a multilayer structure including a diffusion barrier layer, according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art.

Expressions such as "at least one of" when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, according to example embodiments, diffusion barrier layers, multilayer structures including the diffusion barrier layers, and devices including the same will be described in detail with reference to the accompanying drawings. In the drawings, the widths and thicknesses of layers and regions may be exaggerated for clarity and convenience. Like reference numerals in the drawing denote like elements.

FIG. 1 is a cross-sectional view of a multilayer structure M100 including a diffusion barrier layer B10, according to example embodiments.

Referring to FIG. 1, the multilayer structure M100 may include a first material layer L10, a second material layer L20 spaced apart from the first material layer L10, and a diffusion barrier layer B10 disposed between the first material layer L10 and the second material layer L20. The first material layer L10 and the second material layer L20 may include different materials. The diffusion barrier layer B10 may serve to limit or prevent materials (atoms) from moving or diffusing between the first material layer L10 and the second material layer L20. The diffusion barrier layer B10 may include a two-dimensional (2D) material. The 2D material included in the diffusion barrier layer B10 may be a 2D material that is not a graphene. In other words, the 2D material included in the diffusion barrier layer B10 may be a non-graphene-based material. For example, the 2D material may be a metal chalcogenide-based material having a 2D crystal structure. The diffusion barrier layer B10 including the 2D material may have excellent diffusion barrier characteristics and may be formed to have a very small thickness. Specific configurations of the diffusion barrier layer B10 and effects and features of the diffusion barrier layer B10 will be described later in more detail.

One of the first and second material layers L10 and L20 of FIG. 1 may be a conductor and the other may be a semiconductor. Alternatively, one of the first and second material layers L10 and L20 may be a conductor and the other may be an insulator. The former case is illustrated in FIG. 2 and the latter case is illustrated in FIG. 3.

Figure 2:
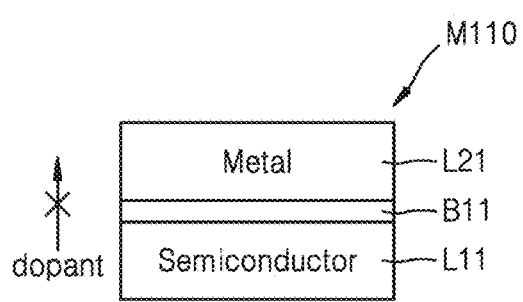
FIG. 2 is a cross-sectional view of a multilayer structure including a diffusion barrier layer, according to example embodiments.

Referring to FIG. 2, a first material layer L11 of a multilayer structure M110 may be a semiconductor layer and a second material layer L21 may be a conductive layer. The first material layer L11 may be a semiconductor layer doped with a desired (and/or alternatively predetermined) impurity (dopant) and the second material layer L21 may be a metal layer or a metal compound layer. In this case, a diffusion barrier layer B11 may be disposed between the first material layer L11 and the second material layer L21, and may serve to limit or prevent the impurity (dopant) doped into the first material layer L11 from moving or diffusing toward the second material layer L21.

Figure 3:
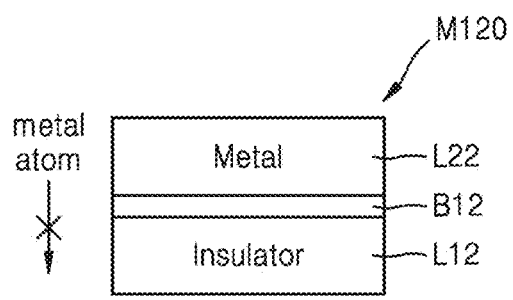
FIG. 3 is a cross-sectional view of a multilayer structure including a diffusion barrier layer, according to example embodiments.

Referring to FIG. 3, a first material layer L12 of a multilayer structure M120 may be an insulating layer and a second material layer L22 may be a conductive layer. The first material layer L12 may be an insulating layer including silicon oxide, silicon nitride, or silicon oxynitride, or may be an insulating layer including a high-k material. The high-k material may have a dielectric constant higher than the dielectric constant of silicon oxide. The high-k material may also have a higher dielectric constant than the dielectric constant of silicon nitride. Alternatively, the first material layer L12 may include an organic insulating material. Any insulating materials used in general electronic devices or semiconductor devices may be applied to the first material layer L12. Similar to the second material layer L21 of FIG. 2, the second material layer L22 may be a metal layer or a metal compound layer. In this case, the diffusion barrier layer B12 may serve to limit or prevent a material of the second material layer L22 (e.g., metal atoms) from moving or diffusing toward the first material layer L12.

The diffusion barrier layers B10, B11, and B12 of FIGS. 1 to 3 may include a 2D material. The 2D material may be a single-layer or half-layer solid in which atoms form a desired (and/or alternatively predetermined) crystal structure. The 2D materials constituting the diffusion barrier layers B10, B11, and B12 may include a metal chalcogenide-based material having a 2D crystal structure. The metal chalcogenide-based material may be a 2D semiconductor. The metal chalcogenide-based material may include at least one transition metal selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), and copper (Cu) and may include at least one chalcogen element selected from the group consisting of sulfur (S), selenium (Se), tellurium (Te), and oxygen (O). In this case, the metal chalcogenide-based material may be transition metal dichalcogenide (TMDC). The TMDC may be expressed as $MX_2$, where M is a transition metal and X is a chalcogen element. The M may be one selected from the group consisting of Mo, W, Nb, V, Ta, Ti, Zr, Hf, Tc, Re, Pd, and Pt, and the X may be one selected from the group consisting of S, Se, and Te. For example, the TMDC may be one selected from the group consisting of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and $PdTe_2$. The metal chalcogenide-based material may not be expressed as $MX_2$. For example, a compound (transition metal chalcogenide) of Cu as a transition metal and S as a chalcogen element may be expressed as CuS. Since CuS may also be a 2D material, CuS may be applicable as the metal chalcogenide-based material. In addition, the metal chalcogenide-based material may include two or more transition metals. For example, $MoWSe_4$ may be chalcogenide including two or more transition metals. In addition, the metal chalcogenide-based material may be chalcogenide including a non-transition metal. For example, the non-transition metal may be gallium (Ga), indium (In), tin (Sn), germanium (Ge), or lead (Pb). In other words, a compound of a non-transition metal such as Ga, In, Sn, Ge, or Pb and a chalcogen element such as S, Se, Te, or O may be used as the metal chalcogenide-based material. For example, chalcogenide including the non-transition metal may be one selected from the group consisting of SnSe2, GaS, GaSe, GaTe, GeSe, $In_2Se_3$, and $InSnS_2$. Therefore, the metal chalcogenide-based material includes at least one metallic element selected from the group consisting of Mo, W, Nb, V, Ta, Ti, Zr, Hf, Tc, Re, Ru, Co, Pd, Pt, Cu, Ga, In, Sn, Ge, and Pb and at least one chalcogen element selected from the group consisting of S, Se, Te, and O. However, the above-mentioned materials (elements) are merely non-limiting examples, and any other materials (elements) may also be applied.

The 2D materials constituting the diffusion barrier layers B10, B11, and B12 may have a trigonal prismatic crystal structure or an octahedral crystal structure. For example, a 2D material including a metal element of group 5 or 6 may have a trigonal prismatic crystal structure. Specifically, a 2D material (TMDC) such as MoS2 may have a trigonal prismatic crystal structure. On the other hand, a 2D material including a metal element of group 4, 7, or 10 may have an octahedral crystal structure. The octahedral crystal structure may be a trigonal antiprismatic crystal structure. The trigonal prismatic crystal structure and the octahedral crystal structure will be described below in more detail with reference to FIGS. 4 to 9. However, the crystal structures of the diffusion barrier layers B10, B11, and B12 are not limited to the trigonal prismatic structure and the octahedral structure and may be changed.

The diffusion barrier layers B10, B11, and B12 may be a single layer including a 2D material or may have a structure in which single layers including a 2D crystal structure are repeatedly stacked. Even when the single layers are repeatedly stacked, characteristics of the 2D material may be maintained. In terms of an electronic structure, a 2D material may be defined as a material of which a density of state (DOS) follows a quantum well behavior. A DOS of a material in which a plurality of 2D unit material layers are stacked (about 100 layers or less) may also follow a quantum well behavior. In this respect, the structure in which the single layers are repeatedly stacked may also be referred to as a "2D material". In the structure in which the single layers are repeatedly stacked, the single layers may be bonded to one another by a Van der Waals force.

The diffusion barrier layers B10, B11, and B12 may have thicknesses in range of about 1 nm to about 10 nm. The diffusion barrier layers B10, B11, and B12 may have thicknesses of about 10 nm or less, for example, about 5 nm or less. The diffusion barrier layers B10, B11, and B12 may have a very small thickness of about 3 nm or less. Furthermore, the diffusion barrier layers B10, B11, and B12 may have a thickness of about 1 nm or less. The diffusion barrier layers B10, B11, and B12 including the 2D material may have a small thicknesses and maintain excellent characteristics while having a small thicknesses. Such diffusion barrier layers B10, B11, and B12 may be applied to a high-integration device having a fine line width.

The diffusion barrier layers B10, B11, and B12 may have a resistivity of about 10–2 $\Omega$·cm or less. For example, the diffusion barrier layers B10, B11, and B12 may have a resistivity of about $10^{-4}$ $\Omega$·cm to $10^{-2}$ $\Omega$·cm. Since the diffusion barrier layers B10, B11, and B12 may have a low resistivity, the diffusion barrier layers B10, B11, and B12 may have an excellent electrical conductivity. For example, a 2D material (TMDC) including a metal (transition metal) of group 5 may have a low resistivity of about $10^{-4}$ $\Omega$·cm and may have an excellent electrical conductivity similar to that of a metal or a semimetal. In addition, since a 2D material (TMDC) including a metal (transition metal) of group 6 may have a low resistivity of about $10^{-3}$ $\Omega$·cm, an excellent electrical conductivity may be exhibited.

The diffusion barrier layers B10, B11, and B12 may be a layer doped with a dopant. In this case, the dopant may fill a structurally and relatively weak portion (that is, defective portion) such as a vacancy or a grain boundary of the diffusion barrier layers B10, B11, and B12. Therefore, diffusion barrier characteristics of the diffusion barrier layers B10, B11, and B12 may be reinforced by the dopant. The dopant may include at least one metal element selected from the group consisting of Mo, W, Nb, V, Ta, Ti, Zr, Hf, Tc, Re, Ru, Co, Pd, Pt, Cu, Ga, In, Sn, Ge, and Pb. Alternatively, the dopant may include an element (e.g., Si) that does not diffuse well. However, the dopant is not limited to the above-mentioned materials and may be variously changed. Any materials may be used as the dopant as long as the materials can be doped into graphene or other 2D materials. The dopant may be doped into the diffusion barrier layers B10, B11, and B12 by using a chemical doping method, for example. As the diffusion barrier layers B10, B11, and B12 is doped with a desired (and/or alternatively predetermined) dopant, characteristics thereof, such as the electrical conductivity, may be improved. In other words, the electrical conductivity of the diffusion barrier layers B10, B11, and B12 may be increased by the dopant.

An existing TiN layer and an existing TaN layer may be amorphous and it may be difficult to form the TiN layer and the TaN layer to have a thickness of about 5 nm or less or about 3 nm or less. Therefore, the TiN layer or the TaN layer may be hardly applied to a high-integration device or an ultra-high-integration device. Although the TiN layer has a resistivity of about $1.3 \times 10^{-4}$ $\Omega$·cm and the TaN layer has a resistivity of about $2.5 \times 10^{-4}$ $\Omega$·cm, it is difficult to reduce the thicknesses of the TiN layer and the TaN layer. Therefore, as a line width of a device is reduced, the TiN layer or the TaN layer may act as a resistance increase factor. However, the diffusion barrier layers B10, B11, and B12 according to example embodiments may have a low resistivity of about $10^{-4}$ $\Omega$·cm or less while having excellent diffusion barrier characteristics and may have a very small thickness of about 5 nm or less or about 3 nm or less. In addition, the diffusion barrier layers B10, B11, and B12 may be crystalline and may have structurally/thermally/electrically stable characteristics. Therefore, the diffusion barrier layers B10, B11, and B12 may be easily applied to a high-integration device (ultra-high-integration device) having a fine line width. In other words, the diffusion barrier layers B10, B11, and B12 may serve to increase stability, reliability, and durability of the device without substantially increasing a resistance of the high-integration device (ultra-high-integration device).

Hereinafter, crystal structures of the 2D materials of the diffusion barrier layers B10, B11, and B12 will be described with reference to FIGS. 4 to 9.

Figure 4:
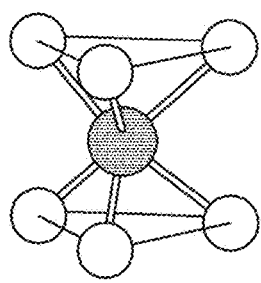
FIG. 4 is a diagram of a trigonal prismatic crystal structure of a diffusion barrier layer, according to example embodiments.
Figure 4:
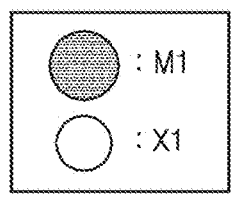

FIG. 4 is a diagram of a trigonal prismatic crystal structure of a diffusion barrier layer, according to example embodiments. In FIG. 4, reference numeral M1 denotes a metal element and reference numeral X1 denotes a chalcogen element. For example, a 2D material (TMDC) including a metal element of group 5 or 6 may have the crystal structure of FIG. 4.

Figure 5:
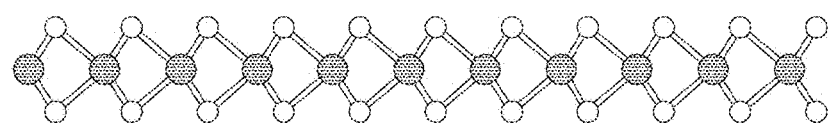
FIG. 5 is a side view of a diffusion barrier layer having a plurality of trigonal prismatic crystal structures of FIG. 4 that are two-dimensionally and continuously arranged.

The trigonal prismatic crystal structure of FIG. 4 may be two-dimensionally and continuously arranged to form a diffusion barrier layer. FIG. 5 is a side view of the structure of the diffusion barrier layer, and FIG. 6 is a top view of the structure of the diffusion barrier layer.

Figure 7:
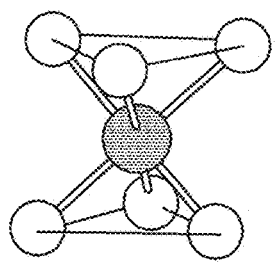
FIG. 7 is a diagram of an octahedral crystal structure of a diffusion barrier layer, according to example embodiments.
Figure 7:
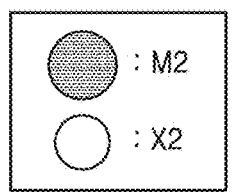

FIG. 7 is a diagram of an octahedral crystal structure of a diffusion barrier layer, according to example embodiments. In FIG. 7, reference numeral M2 denotes a metal element and reference numeral X2 denotes a chalcogen element. For example, a 2D material (TMDC) including a metal element of group 4, 7, or 10 may have the octahedral crystal structure illustrated in FIG. 7. The 2D material having the octahedral crystal structure illustrated in FIG. 7 may have relatively metallic characteristics. Therefore, the diffusion barrier layer including such a 2D material may have an excellent electrical conductivity. The octahedral crystal structure of FIG. 7 may be referred to as a trigonal antiprismatic crystal structure.

Figure 8:
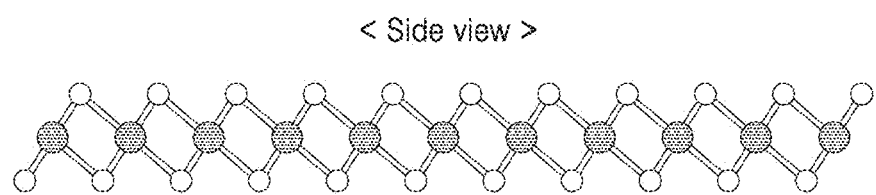
FIG. 8 is a side view of a diffusion barrier layer having a plurality of octahedral crystal structures of FIG. 7 that are two-dimensionally and continuously arranged.
Figure 9:
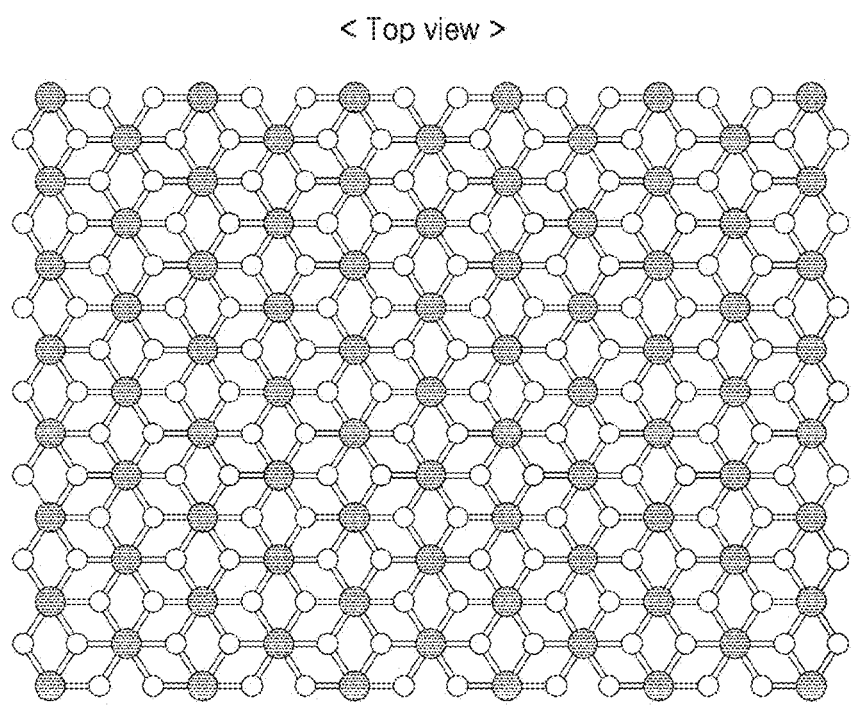
FIG. 9 is a top view of the diffusion barrier layer having the plurality of octahedral crystal structures of FIG. 7 that are two-dimensionally and continuously arranged.

The octahedral crystal structure of FIG. 7 may be two-dimensionally and continuously arranged to form a diffusion barrier layer. FIG. 8 is a side view of the structure of the diffusion barrier layer, and FIG. 9 is a top view of the structure of the diffusion barrier layer.

Figure 6:
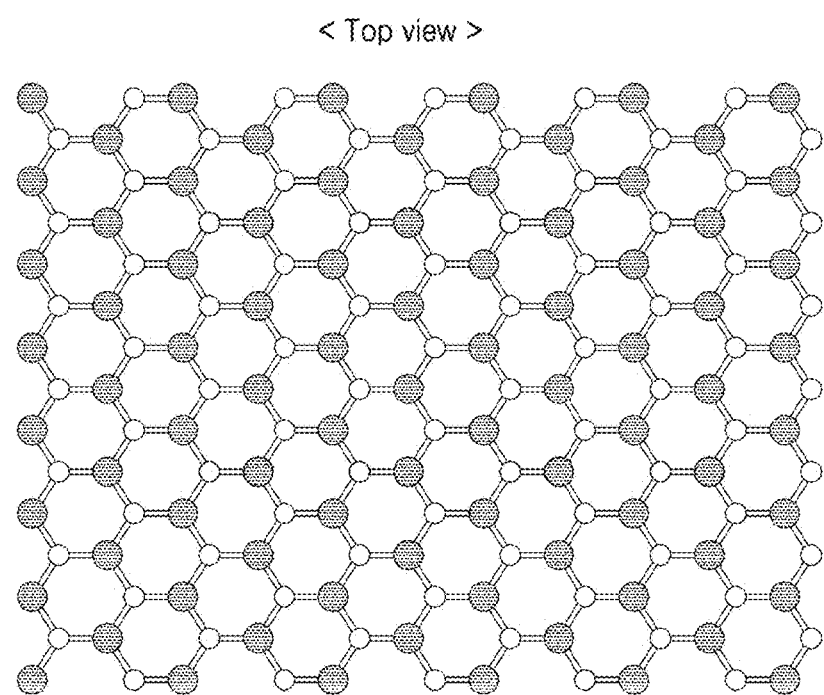
FIG. 6 is a top view of the diffusion barrier layer having the plurality of trigonal prismatic crystal structures of FIG. 4 that are two-dimensionally and continuously arranged.

The single layers of FIGS. 5 and 6 may be repeatedly stacked to form a single diffusion barrier layer. Similarly, the single layers of FIGS. 8 and 9 may be repeatedly stacked to form a single diffusion barrier layer. At this time, the single layers may be stacked to form various structures such as a 2H structure, a 3R structure, or a 1T structure. However, the crystal structures of the diffusion barrier layer described above with reference to FIGS. 4 to 9 are merely non-limiting examples, and the diffusion barrier layer may also have other crystal structures.

Figure 10:
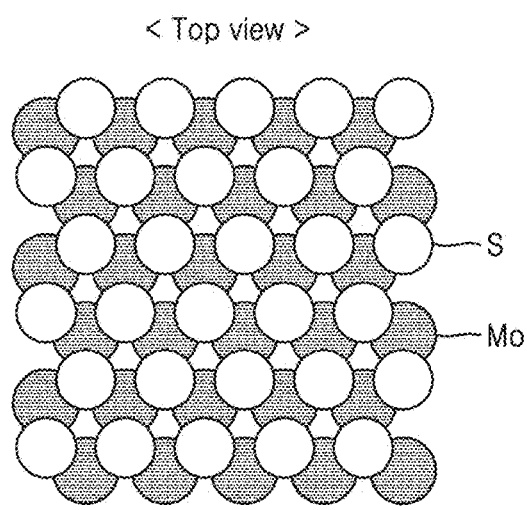
FIG. 10 is a top view of a two-dimensional atomic arrangement structure of a diffusion barrier layer, according to example embodiments.

FIG. 10 is a top view of a 2D atomic arrangement structure of a diffusion barrier layer, according to example embodiments. Specifically, FIG. 10 illustrates a case where the diffusion barrier layer includes $MoS_2$ as a 2D material. As illustrated in FIG. 10, Mo atoms and S atoms may be two-dimensionally arranged while forming a desired (and/or alternatively predetermined) crystal structure. $MoS_2$ of FIG. 10 may have the trigonal prismatic crystal structure of FIG. 4. Therefore, the structure of FIG. 10 may correspond to the structure of FIG. 6.

Figure 11:
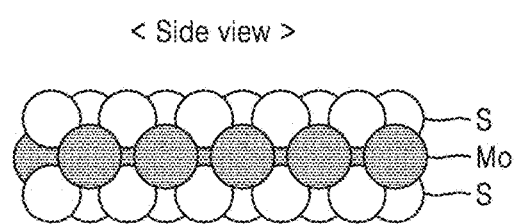
FIG. 11 is a side view of the diffusion barrier layer of FIG. 10.

FIG. 11 is a side view of the diffusion barrier layer of FIG. 10. Referring to FIG. 11, S atoms may be arranged above and below Mo atoms. The structure of FIG. 11 may correspond to the structure of FIG. 5.

Figure 12:
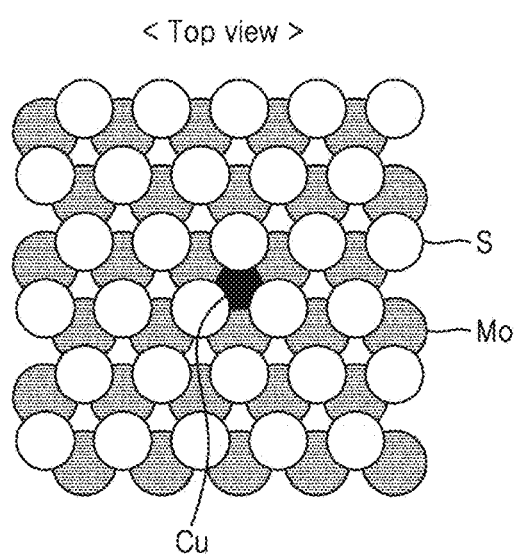
FIG. 12 is a schematic diagram for describing a case where a metal atom (Cu atom) moves through a diffusion barrier layer, according to example embodiments.

FIG. 12 is a schematic diagram for describing a case where a metal atom (Cu atom) moves through a diffusion barrier layer, according to example embodiments. Specifically, FIG. 12 illustrates a case where the metal atom (Cu atom) moves or diffuses through the diffusion barrier layer (MoS2 layer) having the structure of FIG. 10. As a result of simulation, an energy of about 5.2 eV was required in order for the Cu atom to pass through the $MoS_2$ layer. From this simulation, it is possible to estimate a diffusion barrier effect of the $MoS_2$ layer. In a case where a plurality of $MoS_2$ layers are used as the diffusion barrier layer, it is possible to ensure more excellent diffusion barrier characteristics.

Figure 13:
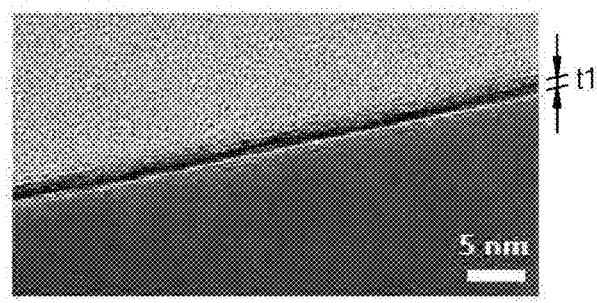
FIG. 13 is a transmission electron microscope (TEM) image for describing a case where an $MoS_2$ layer applicable to a diffusion barrier layer is formed on a substrate, according to example embodiments.

FIG. 13 is a transmission electron microscope (TEM) image for describing a case where a $MoS_2$ layer applicable to a diffusion barrier layer is formed on a substrate, according to example embodiments. Referring to FIG. 13, it can be seen that the MoS2 layer has a 2D layer structure. In addition, it can be seen that the MoS2 layer has a very small thickness t1 of greater than 0 nm and less than about 2 nm.

Figure 14:
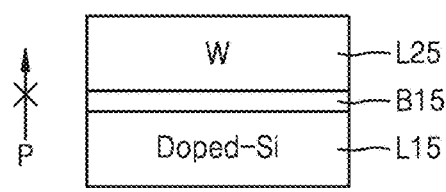
FIG. 14 is a cross-sectional view of a multilayer structure including a diffusion barrier layer, according to example embodiments.
Figure 15:
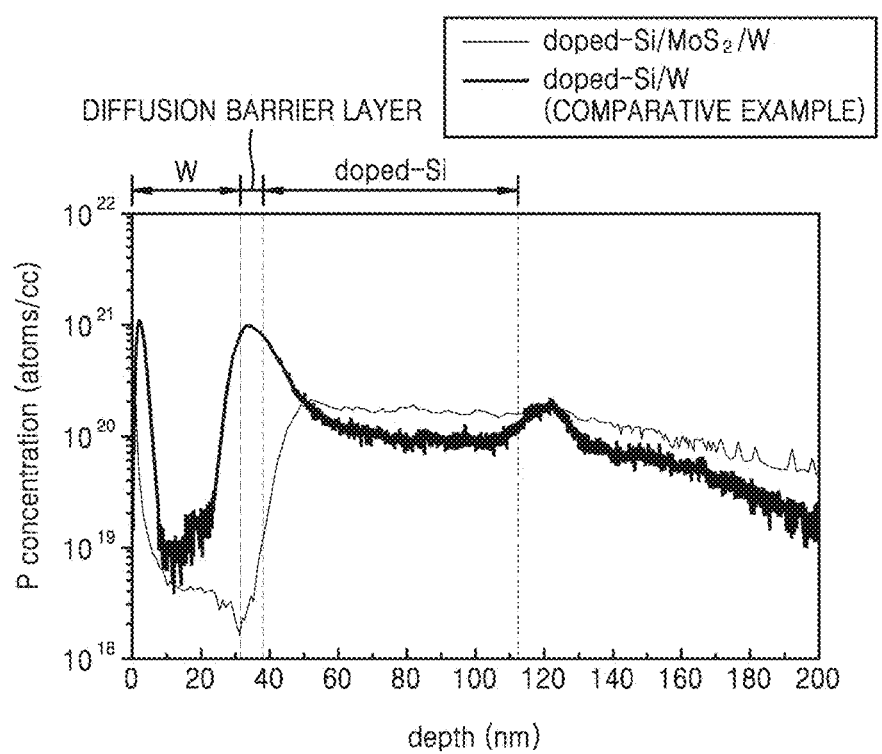
FIG. 15 is a graph of experimental data that shows a diffusion barrier effect of the diffusion barrier layer of FIG. 14.

FIG. 14 is a cross-sectional view of a multilayer structure including a diffusion barrier layer, according to example embodiments, and FIG. 15 is a graph of experimental data that shows a diffusion barrier effect of the diffusion barrier layer of FIG. 14.

Referring to FIG. 14, the multilayer structure may have a diffusion barrier layer B15 disposed between a silicon layer L15 and a tungsten layer L25. The silicon layer L15 may include polycrystalline silicon (that is, polysilicon), and may be doped with phosphorus (P). The diffusion barrier layer B15 may include a 2D material such as $MoS_2$ or $WS_2$. For example, the diffusion barrier layer B15 may be a $MoS_2$ layer. In this case, the multilayer structure of FIG. 14 has a doped-Si/MoS$_2$/W structure. The diffusion barrier layer B15 may serve to limit or prevent P atoms doped into the silicon layer L15 from moving or diffusing toward the tungsten layer L25.

FIG. 15 is a graph showing a result obtained by measuring a change in P concentration according to a depth after annealing at a temperature of about 800° C. The result of FIG. 15 also includes a result obtained by measuring a change in P concentration according to a depth after annealing a structure having no diffusion barrier layer B15 in FIG. 14 (comparative example), that is, a doped-Si/W structure in the same condition.

Referring to FIG. 15, in a case where the diffusion barrier layer B15 (e.g., $MoS_2$ layer) is used, a relatively small amount of P exists in the tungsten layer L25, as compared with the comparative example. Therefore, it is possible to confirm a diffusion barrier effect of the diffusion barrier layer B15.

Figure 16:
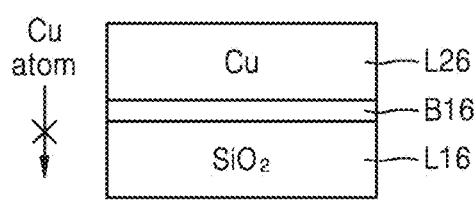
FIG. 16 is a cross-sectional view of a multilayer structure including a diffusion barrier layer, according to example embodiments.
Figure 17:
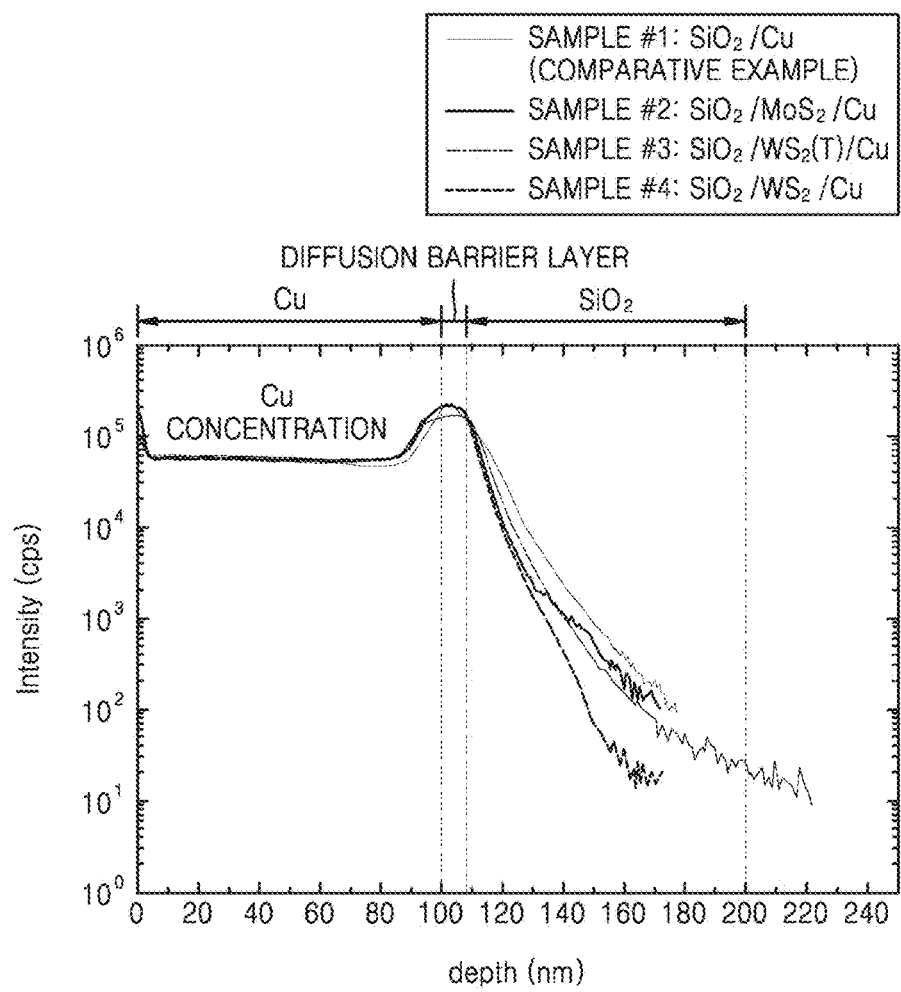
FIG. 17 is a graph of experimental data that shows a diffusion barrier effect of the diffusion barrier layer of FIG. 16.

FIG. 16 is a cross-sectional view of a multilayer structure including a diffusion barrier layer, according to example embodiments, and FIG. 17 is a graph of experimental data that shows a diffusion barrier effect of the diffusion barrier layer of FIG. 16.

Referring to FIG. 16, the multilayer structure may include a diffusion barrier layer B16 disposed between a silicon oxide layer L16 and a copper layer L26. The silicon oxide layer L16 may be an insulating layer including $SiO_2$. The diffusion barrier layer B16 may include a 2D material such as $MoS_2$ or $WS_2$. For example, the diffusion barrier layer B16 may be a $MoS_2$ layer or a $WS_2$ layer. Therefore, the multilayer structure of FIG. 16 has a $SiO_2/MoS_2$/Cu structure or a $SiO_2/WS_2$/Cu structure. The diffusion barrier layer B16 may serve to limit or prevent Cu atoms of the copper layer L26 from moving or diffusing toward the silicon oxide layer L16.

FIG. 17 is a graph of a result obtained by measuring a change in Cu concentration according to a depth after annealing the multilayer structure of FIG. 16 at a temperature of about 300° C. for about one hour. The result of FIG. 17 also includes a result obtained by measuring a change in Cu concentration according to a depth after annealing a structure having no diffusion barrier layer B16 in FIG. 16 (comparative example), that is, a $SiO_2$/Cu structure in the same condition. In FIG. 17. Sample #1 is a result of the $SiO_2$/Cu structure (comparative example). Sample #2 is a result of the SiO$_2$/MoS$_2$/Cu structure. Sample #3 is a result of a SiO$_2$/WS$_2$(T)/Cu structure. Sample #4 is a result of the SiO$_2$/WS$_2$/Cu structure. In the sample #3, WS$_2$(T) means that a WS$_2$ layer is formed by a transfer method.

Referring to FIG. 17, in a case where a 2D material layer such as a MoS$_2$ layer or a WS$_2$ layer is used as the diffusion barrier layer B16 (samples #2 to #4), a relatively small amount of Cu exists in a silicon oxide layer (SiO$_2$ layer) L16, as compared other cases (comparative example: sample #1). In particular, in the sample #4, it can be seen that a diffusion amount of Cu is significantly reduced, as compared with the sample #1. Accordingly, it is possible to confirm a diffusion barrier effect of the diffusion barrier layer B16 in the structure of FIG. 16.

According to example embodiments, multilayer structures M100, M110, and M120 of FIGS. 1 to 3 may further include an adhesion layer disposed between the diffusion barrier layer B10, B11, or B12 and one of the first material layer L10, L11, or L12 and the second material layer L20, L21, or L22. Examples in which the adhesion layer is applied to the structures of FIGS. 2 and 3 are illustrated in FIGS. 18 and 19, respectively.

Figure 18:
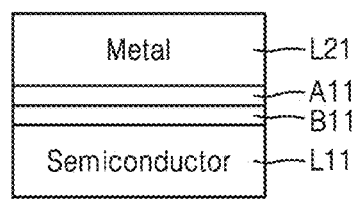
FIG. 18 is a cross-sectional view of a multilayer structure including a diffusion barrier layer, according to example embodiments.
Figure 19:
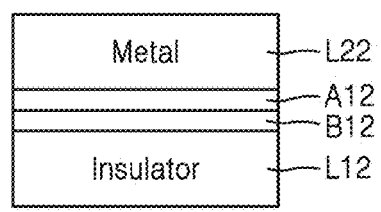
FIG. 19 is a cross-sectional view of a multilayer structure including a diffusion barrier layer, according to example embodiments.

Referring to FIGS. 18 and 19, the diffusion barrier layers B11 and B12 may be respectively disposed between the first material layers L11 and L12 and the second material layers L21 and L22. Adhesion layers A11 and A12 may be respectively disposed between the diffusion barrier layers B11 and B12 and the second material layers L21 and L22. At this time, the second material layers L21 and L22 may be conductive layers each including a metal or a metal compound. Therefore, the adhesion layers A11 and A12 are respectively disposed between the diffusion barrier layers B11 and B12 and the conductive layers (metallic layers) L21 and L22.

The adhesion layers A11 and A12 may be respectively disposed between the diffusion barrier layers B11 and B12 and the second material layers L21 and L22 so as to reinforce an adhesive force. For example, each of the adhesion layers A11 and A12 may be a metal layer. Specifically, each of the adhesion layers A11 and A12 may include at least one metal selected from the group consisting of Mo, W, Nb, V, Ta, Ti, Zr, Hf, Tc, Re, Ru, Co, Pd, Pt, Cu, Ga, In, Sn, Ge, and Pb. The adhesion layers A11 and A12 may include substantially the same metal element as the metal element included in the diffusion barrier layers B11 and B12. Each of the adhesion layers A11 and A12 may have a small thickness of about several nanometers or less and may have excellent electrical conductivity characteristics. For example, each of the adhesion layers A11 and A12 may have a thickness of about 1 nm to about 10 nm.

According to example embodiments, a diffusion barrier layer having a multilayer structure may be used. In this case, the diffusion barrier layer having the multilayer structure may include different types of a plurality of 2D material layers. An example of the diffusion barrier layer having the multilayer structure is illustrated in FIG. 20.

Figure 20:
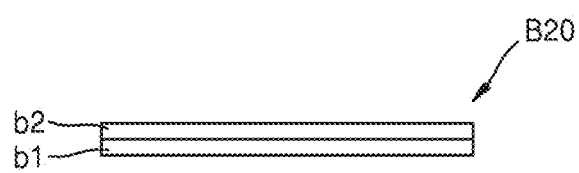
FIG. 20 is a cross-sectional view of a diffusion barrier layer, according to example embodiments.

Referring to FIG. 20, a diffusion barrier layer B20 may have a multilayer structure. In this case, the diffusion barrier layer B20 may include different types of a plurality of 2D material layers, for example, a first 2D material layer b1 and a second 2D material layer b2. At least one of the first 2D material layer b1 and the second 2D material layer b2 may correspond to the diffusion barrier layers B10, B11, and B12 described above with reference to FIGS. 1 to 3, and the other may include graphene or other 2D materials. In a case where the diffusion barrier layer B20 is formed by using different types of the plurality of 2D material layers b1 and b2, it is possible to obtain excellent diffusion barrier effects. In addition, in a case where each of the first 2D material layer b1 and the second 2D material layer b2 is formed as a single layer, the diffusion barrier layer B20 may have a very small thickness of about 5 nm or less or about 3 nm or less. The diffusion barrier layer B20 having such a multilayer structure may be applied to the structures of FIGS. 1 to 3, 14, 16, 18, and 19. Although not illustrated, the diffusion barrier layer B20 may include three or more different 2D material layers.

Figure 21:
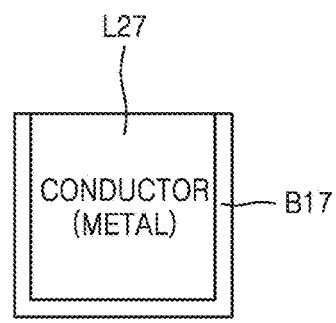
FIG. 21 is a cross-sectional view of a multilayer structure including a diffusion barrier layer, according to example embodiments.

FIG. 21 is a cross-sectional view of a multilayer structure including a diffusion barrier layer B17, according to example embodiments.

Referring to FIG. 21, the diffusion barrier layer B17 may be provided to cover at least one surface of a conductive material layer L27. For example, the diffusion barrier layer B17 may be provided to cover a bottom surface and side surfaces of the conductive material layer L27. The conductive material layer L27 may be a layer including a metal or a metal compound. The diffusion barrier layer B17 may include a material substantially equal or similar to those of the diffusion barrier layers B10, B11, B12, and B20 described above with reference to FIGS. 1 to 3, and 20. Although not illustrated, another material layer bonded to the conductive material layer L27, with the diffusion barrier layer B17 disposed therebetween, may be further provided. The other material layer may be a semiconductor layer or an insulating layer. In addition, an adhesion layer may be further provided between the diffusion barrier layer B17 and the conductive material layer L27.

Figure 22:
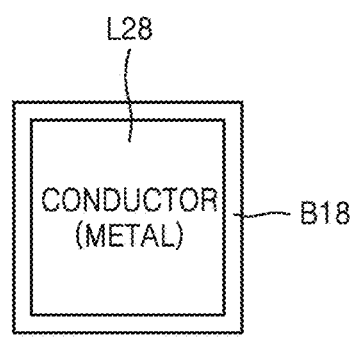
FIG. 22 is a cross-sectional view of a multilayer structure including a diffusion barrier layer, according to example embodiments.

FIG. 22 is a cross-sectional view of a multilayer structure including a diffusion barrier layer B18, according to example embodiments.

Referring to FIG. 22, the diffusion barrier layer B18 may have a structure that surrounds a conductive material layer L28. In other words, the diffusion barrier layer B18 may be provided to cover four surfaces (top surface, bottom surface, and both side surfaces) of the conductive material layer L28. A material of the diffusion barrier layer B18 may correspond to the material of the diffusion barrier layer B17 of FIG. 21, and a material of the conductive material layer L28 may correspond to the material of the conductive material layer L27 of FIG. 21. Although not illustrated, another material layer bonded to the conductive material layer L28, with the diffusion barrier layer B18 disposed therebetween, may be further provided. The other material layer may be a semiconductor layer or an insulating layer. In addition, an adhesion layer may be further provided between the diffusion barrier layer B18 and the conductive material layer L28.

Figure 23:
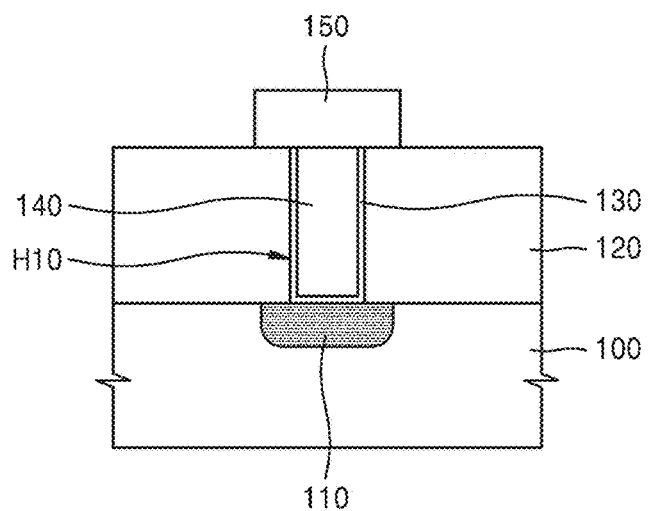
FIG. 23 is a cross-sectional view of a part of an electronic device (semiconductor device) including a diffusion barrier layer, according to example embodiments.

FIG. 23 is a cross-sectional view of a part of an electronic device (semiconductor device) including a diffusion barrier layer 130, according to example embodiments.

Referring to FIG. 23, the electronic device may include an understructure (e.g., lower structure) 100. The understructure 100 may include a semiconductor region 110. The semiconductor region 110 may be a region doped with a desired (and/or alternatively predetermined) impurity (dopant). Although not illustrated, the understructure 100 may have a "device portion" including the semiconductor region 110. An insulating material layer 120 having an opening H10 may be disposed on the understructure 100. The opening H10 may be a type of a through-hole (via hole). The semiconductor region 110 may be exposed by the opening H10.

The electronic device may include the diffusion barrier layer 130 that covers a surface of the semiconductor region 110 exposed by the opening H10 and an inner surface of the opening H10. The diffusion barrier layer 130 may include a non-graphene-based 2D material. The diffusion barrier layer 130 may have substantially the same materials as the diffusion barrier layers described above with reference to FIGS. 1 to 20. Therefore, the 2D material of the diffusion barrier layer 130 may include a metal chalcogenide-based material having a 2D crystal structure. The metal chalcogenide-based material may include at least one metal element selected from the group consisting of Mo, W, Nb, V, Ta, Ti, Zr, Hf, Tc, Re, Ru, Co, Pd, Pt, Cu, Ga, In, Sn, Ge, and Pb and at least one chalcogen element selected from the group consisting of S, Se, Te, and O. The diffusion barrier layer 130 may have a thickness of about 10 nm or less, for example, about 5 nm or less. The diffusion barrier layer 130 may have a very small thickness of about 3 nm or less. The diffusion barrier layer 130 may have a thickness of about 1 nm or less.

The electronic device may include a conductive plug 140 on the diffusion barrier layer 130 inside the opening H10. The conductive plug 140 may include a metal or a metallic material such as a metal compound. The diffusion barrier layer 130 may serve to limit or prevent a material from diffusing between the semiconductor region 110 and the conductive plug 140. The diffusion barrier layer 130 may serve to limit or prevent an impurity (dopant) of the semiconductor region 110 from diffusing into the conductive plug 140. In addition, the diffusion barrier layer 130 may serve to limit or prevent a material from diffusing between the insulating material layer 120 and the conductive plug 140. The electronic device may further include an electrode 150 contacting the conductive plug 140 on the insulating material layer 120. The electrode 150 may have a wiring shape or a pad shape. The electrode 150 may include a metal or a metallic compound. The electrode 150 may include substantially the same material as the conductive plug 140 or may include a different material from the conductive plug 140. Although not illustrated in FIG. 23, the electronic device may further include an adhesion layer between the diffusion barrier layer 130 and the conductive plug 140. The adhesion layer may include a material substantially equal or similar to those of the adhesion layers A11 and A12 described above with reference to FIGS. 18 and 19.

Figure 24:
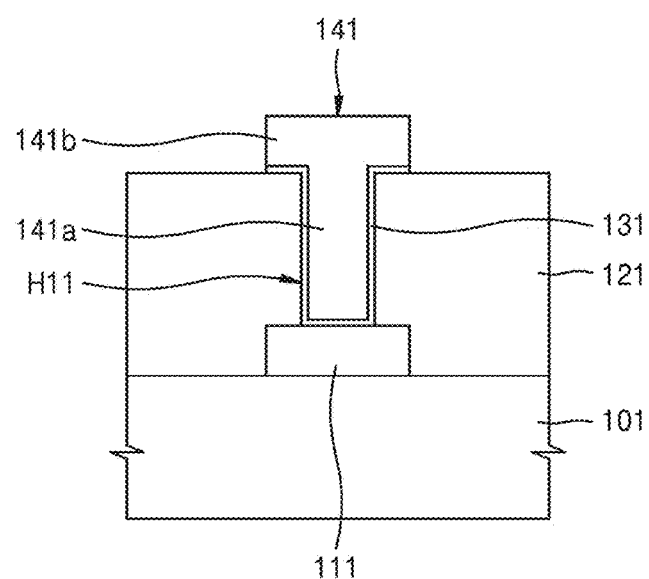
FIG. 24 is a cross-sectional view of a part of an electronic device (semiconductor device) including a diffusion barrier layer, according to example embodiments.

FIG. 24 is a cross-sectional view of a part of an electronic device (semiconductor device) including a diffusion barrier layer 131, according to example embodiments.

Referring to FIG. 24, the electronic device may include an understructure 101. An element layer 111 may be disposed on the understructure 101. The element layer 111 may be an electrode connected to a device portion (not illustrated) or may be a part of the device portion. The element layer 111 may be regarded as being included in the understructure 101. In other words, the understructure 101 may be regarded as including the element layer 111. An insulating material layer 121 covering the element layer 111 may be disposed on the understructure 101. An opening H11 may be provided within the insulating material layer 121. The opening H11 may be formed to expose a part of the element layer 111. The electronic device may include the diffusion barrier layer 131 that covers a surface of the element layer 111 exposed by the opening H11 and an inner surface of the opening H11. The diffusion barrier layer 131 may have a structure that extends to the insulating material layer 121 around the opening H11. The diffusion barrier layer 131 may have a material substantially equal or similar to that of the diffusion barrier layer 130 of FIG. 23. A conductor 141 may be disposed on the diffusion barrier layer 131 inside the opening H11. The conductor 141 may include a conductive plug 141a inside the opening H11, and an electrode portion 141b disposed thereon. The electrode portion 141b may have a wiring shape or a pad shape. Although a case where the conductive plug 141a and the electrode portion 141b connected thereto are formed of substantially the same material is illustrated in FIG. 24, the conductive plug 141a and the electrode portion 141b may be formed of different materials. According to example embodiments, the diffusion barrier layer 131 may serve to limit (and/or prevent) a material from diffusing between the conductor 141 and the insulating material layer 121. In addition, the diffusion barrier layer 131 has a low resistivity and an excellent electrical conductivity. Hence, when the element layer 111 is an electrode, a current flow between the element layer 111 and the conductor 141 through the diffusion barrier layer 131 may be facilitated. Although not illustrated in FIG. 24, the electronic device may further include an adhesion layer between the diffusion barrier layer 131 and the conductive plug 141a. The adhesion layer may include a material substantially equal or similar to those of the adhesion layers A11 and A12 described above with reference to FIGS. 18 and 19.

The diffusion barrier layers 130 and 131 of FIGS. 23 and 24 may have a very small thickness of several nanometers or less, which is advantageous to implement a high-integration device. As a degree of integration of the device increases, a size (line width) of the semiconductor region 110 and the element layer 111 may decrease and a size (diameter) of the openings H10 and H11 may also decrease. In this case, when the diffusion barrier layers 130 and 131 are thick, a ratio of the diffusion barrier layers 130 and 131 to the conductive plugs 140 and 141a filling the openings H10 and H11 is increased. Thus, it may be difficult to ensure excellent device characteristics. However, according to example embodiments, since it is possible to form the diffusion barrier layers 130 and 131 having a very small thickness of about 5 nm or less or about 3 nm or less, the small-sized openings H10 and H11 may be easily filled with the diffusion barrier layers 130 and 131 and the conductive plugs 140 and 141a, and a ratio of the conductive plugs 140 and 141a to the diffusion barrier layers 130 and 131 may be increased. Therefore, a high-integration device having excellent characteristics may be easily implemented by using the diffusion barrier layers 130 and 131 according to example embodiments.

Figure 25:
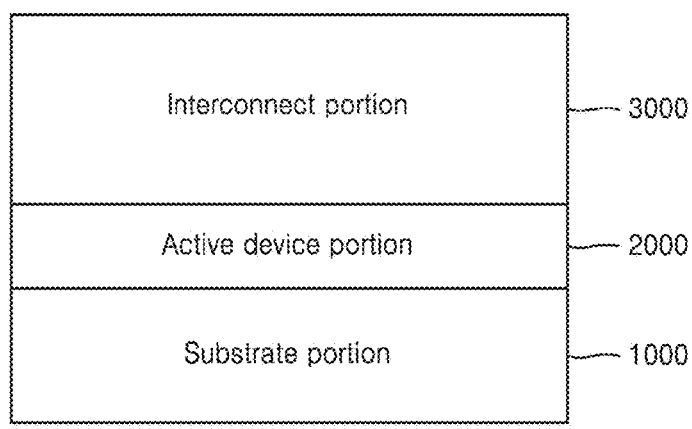
FIG. 25 is a cross-sectional view of an electronic device (semiconductor device) including a diffusion barrier layer, according to example embodiments.

FIG. 25 is a cross-sectional view of an electronic device (semiconductor device) including a diffusion barrier layer, according to example embodiments.

Referring to FIG. 25, in example embodiments, the electronic device (semiconductor device) may include a substrate portion 1000, an active device portion 2000 disposed on the substrate portion 1000, and an interconnect portion 3000 disposed on the active device portion 2000. The active device portion 2000 may include a plurality of transistors (not illustrated). The interconnect portion 3000 may have a structure in which an insulating layer (interlayer insulating layer) and a conductor (electrode/plug) are repeatedly stacked. The interconnect portion 3000 may be a structure to connect the active device portion 2000 to an external device (external terminal) (not illustrated).

The structure (e.g., interconnect structure) including the diffusion barrier layers 130 and 131 described above with reference to FIGS. 23 and 24 may be applied to the interconnect portion 3000 of FIG. 25. In addition, the structure (e.g., interconnect structure) including the diffusion barrier layers 130 and 131 may also be applied to the active device portion 2000 of FIG. 25. In other words, in example embodiments, the structure (e.g., interconnect structure) including the diffusion barrier layers according to may be applied to both a front-end-of-line (FEOL) process and a back-end-of-line (BEOL) process. The FEOL process may be included in a process of manufacturing the active device portion 2000, and the BEOL process may be included in a process of manufacturing the interconnect portion 3000.

Figure 26:
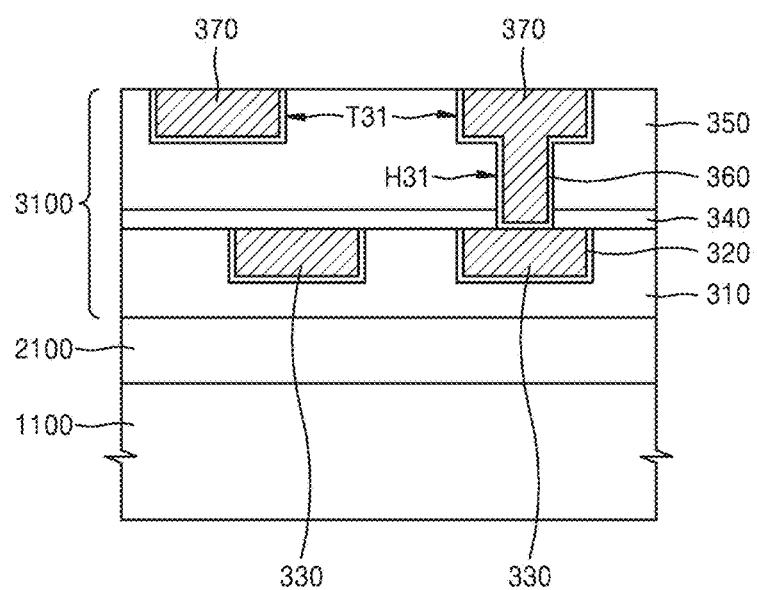
FIG. 26 is a cross-sectional view of an electronic device (semiconductor device) including a diffusion barrier layer, according to example embodiments.

FIG. 26 is a cross-sectional view of an electronic device (semiconductor device) including diffusion barrier layers 320 and 360, according to example embodiments.

Referring to FIG. 26, the electronic device may include an active device portion 2100 on a substrate 1100. Although the substrate 1100 may be a semiconductor substrate such as a silicon substrate, the substrate 1100 may be other semiconductor substrates except for the silicon substrate or may not be the semiconductor substrate. The active device portion 2100 may include a plurality of transistors (not illustrated). A configuration of the active device portion 2100 is not particularly limited and may be variously changed. An interconnect portion 3100 may be disposed on the active device portion 2100. Hereinafter, an example of the configuration of the interconnect portion 3100 will be briefly described.

The interconnect portion 3100 may include a first insulating layer 310 on the active device portion 2100. A first electrode portion 330 may be disposed in the first insulating layer 310. Although not illustrated, the first electrode portion 330 may be electrically connected to the active device portion 2100. A first diffusion barrier layer 320 may be disposed between the first insulating layer 310 and the first electrode portion 330. An intermediate layer 340 covering the first electrode portion 330 may be disposed on the first insulating layer 310. A second insulating layer 350 may be disposed on the intermediate layer 340. The intermediate layer 340 may serve to limit (and/or prevent) a material of the first electrode portion 330 from diffusing into the second insulating layer 350 while protecting the first electrode portion 330. The intermediate layer 340 may include an insulating material. At least one through-hole H31 and at least one trench T31 may be provided in the second insulating layer 350. The through-hole H31 may be formed to expose the first electrode portion 330 through the intermediate layer 340. A plurality of trenches T31 may be provided and one of the plurality of trenches T31 may be provided above the through-hole H31. Each of the through-hole H31 and the trench T31 may also be referred to as an opening. A second diffusion barrier layer 360 may be disposed to cover inner surfaces of the through-hole H31 and the trench T31. A second electrode portion 370 filling the through-hole H31 and the trench T31 may be disposed on the second diffusion barrier layer 360. The second electrode portion 370 provided in the through-hole H31 may have a plug shape, and the second electrode portion 370 provided in the trench T31 may have a wiring shape or a pad shape.

The first and second diffusion barrier layers 320 and 360 may correspond to the diffusion barrier layers according to example embodiments. That is, the first and second diffusion barrier layers 320 and 360 may include a material substantially equal or similar to those the diffusion barrier layers described above with reference to FIGS. 1 to 24. The first diffusion barrier layer 320 may serve to limit or prevent a material from moving between the first insulating layer 310 and the first electrode portion 330, and the second diffusion barrier layer 360 may serve to limit or prevent a material from moving between the second insulating layer 350 and the second electrode portion 370.

Although not illustrated, the electronic device may further include an adhesion layer between the first diffusion barrier layer 320 and the first electrode portion 330 and between the second diffusion barrier layer 360 and the second electrode portion 370. The adhesion layer may include a material substantially equal or similar to those of the adhesion layers A11 and A12 described above with reference to FIGS. 18 and 19. In addition, the interconnect portion 3100 may further include at least one third insulating layer and at least one third electrode portion on the second insulating layer 350. In addition, the uppermost layer of the interconnect portion 3100 may be protected by a passivation layer. The specific configuration of the interconnect portion 3100 illustrated in FIG. 26 is merely a non-limiting example. In an actual device, the interconnect portion 3100 may have a more complicated configuration than the illustrated configuration and may be variously changed.

Methods of manufacturing the above-described diffusion barrier layer, the multilayer structure including the diffusion barrier layer, and the electric device (semiconductor device) including the multilayer structure will be described below.

The diffusion barrier layers B10, B11, and B12 according to example embodiments may be formed in a range from room temperature to about 1,000° C. of a metal precursor including a metal element and a chalcogen source including a chalcogen element. Although the diffusion barrier layers B10, B11, and B12 may be formed by a chemical vapor deposition (CVD) process, the diffusion barrier layers B10, B11, and B12 may also be formed by an atomic layer deposition (ALD) process or other processes. In addition, although a vapor precursor may be used during the forming of the diffusion barrier layers B10, B11, and B12, a liquid or solid precursor may also be used. Various methods that are usable for forming 2D material layers may be applied to form the diffusion barrier layers B10, B11, and B12. Therefore, the diffusion barrier layers B10, B11, and B12 may be easily formed. In this respect, the diffusion barrier layers B10, B11, and B12 have excellent process suitability. Since a method of forming structures of electronic elements except for the diffusion barrier layers B10, B11, and B12 is well known, a detail description thereof will be omitted.

Additionally, since the diffusion barrier layers B10, B11, and B12 according to example embodiments may be formed using 2D materials, the diffusion barrier layers B10, B11, and B12 may have flexible characteristics. Therefore, the diffusion barrier layers B10, B11, and B12 and the multilayer structures including the same may be easily applied to various flexible devices.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. It will be understood by those of ordinary skill in the art that the configurations of the diffusion barrier layer, the multilayer structure including the diffusion barrier layer, and the electronic device (semiconductor device) including the multilayer structure described above with reference to FIGS. 1 to 26 may be variously modified. Specifically, the diffusion barrier layer may have a thickness of about 10 nm or more, and the diffusion barrier layer may be disposed between two different conductive layers (metal layers or metallic material layers) and serve to limit or prevent a material from moving between the two different conductive layers. In addition, the configuration of the electronic device (semiconductor device) to which the diffusion barrier layer is applied may also be variously modified.

While some example embodiments have been particularly shown and described, it will be understood by one of ordinary skill in the art that variations in form and detail may be made therein without departing from the spirit and scope of the claims.

What is claimed is:

1. A multilayer structure comprising:
a first material layer;
a second material layer connected to the first material layer, the second material layer being spaced apart from the first material layer; and
a diffusion barrier layer between the first material layer and the second material layer, the diffusion barrier layer including a non-graphene-based two-dimensional (2D) material.

2. The multilayer structure of claim 1, wherein the 2D material includes a metal chalcogenide-based material having a 2D crystal structure.

3. The multilayer structure of claim 2, wherein
the metal chalcogenide-based material includes at least one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb), and the metal chalcogenide-based material includes at least one chalcogen element selected from the group consisting of sulfur (S), selenium (Se), tellurium (Te), and oxygen (O).

4. The multilayer structure of claim 1, wherein the 2D material includes a transition metal dichalcogenide (TMDC).

5. The multilayer structure of claim 1, wherein the 2D material has a trigonal prismatic crystal structure or an octahedral crystal structure.

6. The multilayer structure of claim 1, wherein the diffusion barrier layer has a thickness of greater than 0 nm and less than or equal to about 5 nm.

7. The multilayer structure of claim 1, wherein the diffusion barrier layer has a thickness of greater than 0 nm and less than or equal to about 3 nm.

8. The multilayer structure of claim 1, wherein the diffusion barrier layer has a resistivity of about $10^{-4}$ $\Omega\cdot$cm to about $10^{-2}$ $\Omega\cdot$cm.

9. The multilayer structure of claim 1, wherein the diffusion barrier layer is doped with a dopant.

10. The multilayer structure of claim 1, wherein
the first material layer includes an insulator, and
the second material layer includes a conductor.

11. The multilayer structure of claim 1, wherein
the first material layer includes a semiconductor, and
the second material layer includes a conductor.

12. The multilayer structure of claim 1, further comprising:
a conductor;
an understructure; and
an insulating material layer on the understructure, wherein
the insulating material layer defines an opening,
the diffusion barrier layer covers the insulating material layer in the opening,
the conductor covers the diffusion barrier layer in the opening,
the first material layer includes at least a part of one of the understructure and the insulating material layer, and
the second material layer includes at least a part of the conductor.

13. The multilayer structure of claim 1, further comprising:
an adhesion layer between the diffusion barrier layer and one of the first and second material layers.

14. The multilayer structure of claim 13, wherein
the adhesion layer includes at least one metal selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb).

15. The multilayer structure of claim 13, wherein a metal in the adhesion layer is the same as a metal in the diffusion barrier layer.

16. The multilayer structure of claim 1, wherein
the diffusion barrier layer includes different types of a plurality of 2D material layers, and
a first 2D material layer among the plurality of 2D material layers includes the non-graphene based 2D material.

17. The multilayer structure of claim 1, wherein at least a part of the multilayer structure is an interconnection for an electronic device.

18. A device comprising:
the multilayer structure of claim 1.

19. An electronic device comprising:
the multilayer structure of claim 1;
an understructure;
an insulating material layer on the understructure, the insulating material layer defining an opening; and
a conductor, wherein
the diffusion barrier layer covers the opening of the insulating material layer; and
the conductor is on the diffusion barrier layer in the opening,
the first material layer includes at least a part of one of the understructure and the insulating material layer, and
the second material layer includes at least a part of the conductor.

20. The electronic device of claim 19, wherein the 2D material includes a metal chalcogenide-based material having a 2D crystal structure.

21. The electronic device of claim 20, wherein the metal chalcogenide-based material includes at least one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb), and the metal chalcogenide-based material includes at least one chalcogen element selected from the group consisting of sulfur (S), selenium (Se), tellurium (Te), and oxygen (O).

22. The electronic device of claim 19, wherein the diffusion barrier layer has a thickness of greater than 0 nm and less than or equal to about 5 nm.

23. The electronic device of claim 19, wherein
the understructure includes a semiconductor region, and
the diffusion barrier layer limits a material from diffusing between the semiconductor region and the conductor.

24. The electronic device of claim 19, wherein the diffusion barrier layer limits a material from diffusing between the insulating material layer and the conductor.

25. The electronic device of claim 19, further comprising:
an adhesion layer between the diffusion barrier layer and the conductor.

26. The electronic device of claim 19, comprising:
an interconnect portion, wherein
the interconnect portion includes an active device portion on a substrate portion,
the interconnect portion is on the active device portion, and
the interconnect portion includes the insulating material layer, the diffusion barrier layer, and the conductor.

27. The multilayer structure of claim 1, wherein
the non-graphene-based two-dimensional (2D) material of the diffusion barrier includes at least one metal element selected from the group consisting of tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), gallium (Ga), indium (In), tin (Sn), germanium (Ge), and lead (Pb).

28. The multilayer structure of claim 27, wherein
the non-graphene-based two-dimensional (2D) material of the diffusion barrier includes at least one metal element selected from the group consisting of tungsten (W), niobium (Nb), vanadium (V), tantalum (Ta), titanium (Ti), zirconium (Zr), hafnium (Hf), technetium (Tc), rhenium (Re), ruthenium (Ru), cobalt (Co), palladium (Pd), platinum (Pt), copper (Cu), tin (Sn), and lead (Pb).

\* \* \* \* \*